(12) United States Patent
Nair et al.

(10) Patent No.: US 9,401,740 B2
(45) Date of Patent: Jul. 26, 2016

(54) TRAINING SEQUENCES AND CHANNEL ESTIMATION METHOD FOR SPREAD SPECTRUM BASED SYSTEMS

(71) Applicant: SAMSUNG ELECTRONICS CO., LTD., Suwon-si (KR)

(72) Inventors: Jinesh P. Nair, Bangalore (IN); Sujit Jos, Bangalore (IN)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 13/964,305

(22) Filed: Aug. 12, 2013

(65) Prior Publication Data

US 2014/0056331 A1 Feb. 27, 2014

(30) Foreign Application Priority Data

Aug. 22, 2012 (IN) .......................... 3463/CHE/2012
Mar. 18, 2013 (KR) ...................... 10-2013-0028524

(51) Int. Cl.
*H04B 1/707* (2011.01)
*H04J 13/00* (2011.01)
*H04L 1/00* (2006.01)
*H03M 13/00* (2006.01)

(52) U.S. Cl.
CPC .............. *H04B 1/707* (2013.01); *H04J 13/004* (2013.01); *H03M 13/005* (2013.01); *H04L 1/0003* (2013.01)

(58) Field of Classification Search
CPC ... H04B 1/707; H04L 27/2647; H04L 1/0003
See application file for complete search history.

(56) References Cited

U.S. PATENT DOCUMENTS

| | | | | |
|---|---|---|---|---|
| 2001/0005394 | A1* | 6/2001 | Park ...................... | H04B 1/707 375/141 |
| 2003/0110440 | A1* | 6/2003 | Gutierrez, Jr. ........ | H04L 1/0003 714/790 |
| 2007/0195906 | A1* | 8/2007 | Kim .................... | H04B 7/0671 375/267 |
| 2009/0219803 | A1* | 9/2009 | Jwa ............................. | 370/210 |
| 2009/0257411 | A1* | 10/2009 | Shitara ................ | H04J 11/0069 370/336 |
| 2011/0116534 | A1* | 5/2011 | Seibert et al. ................ | 375/224 |

* cited by examiner

Primary Examiner — Leon-Viet Nguyen
(74) Attorney, Agent, or Firm — NSIP Law

(57) ABSTRACT

A method of a transmitter, includes multiplying a data sequence by a first code, and multiplying a training sequence by a second code that is orthogonal to the first code. The method further includes adding the multiplied data and training sequences, and transmitting, to a receiver, the added data and training sequences.

15 Claims, 6 Drawing Sheets

TRAINING SEQUENCES AND CHANNEL ESTIMATION METHOD FOR SPREAD SPECTRUM BASED SYSTEMS

CROSS-REFERENCE TO RELATED APPLICATIONS

This application claims the benefit under 35 USC 119(a) of Indian Patent Application No. 3463/CHE/2012, filed on Aug. 22, 2012, in the Indian Patent Office, and Korean Patent Application No. 10-2013-0028524, filed on Mar. 18, 2013, in the Korean Intellectual Property Office, the entire disclosures of which are incorporated herein by reference for all purposes.

BACKGROUND

1. Field

The following description relates to training sequences and a channel estimation method for spread spectrum based systems.

2. Description of Related Art

An advancing form of wireless communication is spread spectrum communication. In spread spectrum communication, a frequency of a transmitted signal is deliberately varied. This results in a much greater bandwidth than the signal would have had if its frequency was not varied. Spread spectrum techniques are used for a variety of reasons, such as establishing secure communications, multiple accesses, increasing a resistance to a natural interference, noise and jamming, preventing a detection, and limiting a power flux density.

Spread spectrum telecommunications is a signal structuring technique that employs a direct sequence, frequency hopping, or a hybrid of these, which can be used for multiple accesses and/or multiple functions. This technique decreases a potential interference to other receivers while achieving privacy. Spread spectrum makes use of a sequential noise-like signal structure to spread a narrowband information signal over a relatively wideband (radio) band of frequencies. A receiver correlates received signals to retrieve the original information signal. There are two intentions: either to resist enemy efforts to jam a communications (anti-jam, or AJ), or to hide the fact that the communication was even taking place, sometimes called low probability of intercept (LPI). Frequency-hopping spread spectrum (FHSS), direct-sequence spread spectrum (DSSS), time-hopping spread spectrum (THSS), chirp spread spectrum (CSS), and combinations of these techniques are forms of spread spectrum techniques. Each of these techniques employs pseudorandom number sequences created using pseudorandom number generators to determine and control a spreading pattern of a signal across an allotted bandwidth. Ultra-wideband (UWB) is another modulation technique that accomplishes the same purpose, based on transmitting short duration pulses.

Although, spread spectrum communications is efficient in many cases, there are several disadvantages, such as power levels of all user devices received at a base station having to be equal if bit rates are equal, and therefore, fast power control being needed. In other cases, user devices in a soft handover mode need resources of more than one cell, hence a system capacity may be reduced.

Channel estimation is a component of coherent communication systems. Channel estimation is an estimation of a frequency and/or time domain response of a path between a transmitter and a receiver to an impulse as an input. This can be used to optimize performance and maximize a transmission rate. Pilots or training symbols are transmitted, which are then used by the receiver for channel estimation. The use of such pilots adversely affects a bandwidth efficiency. The loss in the bandwidth efficiency is severe with a deployment of communication techniques like MIMO (Multiple-Input and Multiple-Output), where there is a need to estimate each of links. If a number of antennas increases, such as in large MIMO systems as in a next generation mm-Wave GHz communication like a 60 GHz Industrial, Scientific and Medical (ISM) band as in Institute of Electrical and Electronics Engineers (IEEE) 802.11ad and IEEE 802.15.3c and e-band, bandwidth resources allocated for pilots increases rapidly.

Further, for co-operative communications the problem is further accentuated as an estimate of links from a node and relays are needed. A channel root mean square (rms) delay spread also affects a bandwidth efficiency as a pilot design will need a sufficiency of excitation, which can lead to a loss in a bandwidth efficiency.

Multicarrier spread spectrum techniques, like MC-CDMA (multi carrier code division multiple access) and MC-DS-CDMA (multi carrier direct sequence code division multiple access), are attractive as they have an additional degree of freedom due to a use of spreading codes. Each of the spreading codes is a bit of information, such as a "1", a "0", a "−1", or a "+1" (bipolar). It is anticipated that a next generation interface will evolve from orthogonal frequency-division multiplexing (OFDA)/OFDM Access (OFDMA) to MC-CDMA/MC-DS CDMA due to an additional flexibility offered by the spreading codes. MIMO and co-operative communications may be built on top of such multi carrier spread spectrum systems. Sub sampled OFDM/single-carrier frequency-domain-equalization (SC-FDE) based sub-band wideband systems for 60 GHz and UWB communication are special cases of multi carrier spread spectrum systems.

An alternative to multiplexed pilots is a superimposed pilots based method for channel estimation. In this method, pilots are added to data at a transmitter, and these are used at a receiver to estimate channel coefficients in a presence of interference and noise. A challenge in channel estimation methods is reducing an impact of noise and interference, ensuring a good estimation accuracy and also a good bandwidth efficiency.

Due to abovementioned reasons, existing superimposed training based channel estimation methods where interference is cancelled at a receiver end are time consuming iterative processes. Further, feedback based methods of interference cancellation are not able to cancel noise and data interference efficiently. Hence, there is a need for bandwidth efficient channel estimation while maintaining an estimation accuracy in spread spectrum systems. Further, in energy efficient communications, pilot overhead may need to be reduced.

SUMMARY

In one general aspect, there is provided a method of a transmitter, the method including multiplying a data sequence by a first code, and multiplying a training sequence by a second code that is orthogonal to the first code. The method further includes adding the multiplied data and training sequences, and transmitting, to a receiver, the added data and training sequences.

In another general aspect, there is provided a method of a receiver, the method including receiving, from a transmitter, a signal including a data sequence multiplied by a first code, and a training sequence multiplied by a second code that is orthogonal to the first code, the data and training sequences being added to each other. The method further includes determining a despread signal based on the received signal and the second code, and estimating a channel based on the despread signal and the training sequence.

In still another general aspect, there is provided a transmitter including a processor configured to multiply a data sequence by a first code, and multiply a training sequence by a second code that is orthogonal to the first code. The processor is further configured to add the multiplied data and training sequences, and transmit the added data and training sequences to a receiver.

In yet another general aspect, there is provided a receiver including a processor configured to receive, from a transmitter, a signal including a data sequence multiplied by a first code, and a training sequence multiplied by a second code that is orthogonal to the first code, the data and training sequences being added to each other. The processor is further configured to determine a despread signal based on the received signal and the second code, and estimate a channel based on the despread signal and the training sequence.

Other features and aspects will be apparent from the following detailed description, the drawings, and the claims.

DETAILED DESCRIPTION

Figure 1:
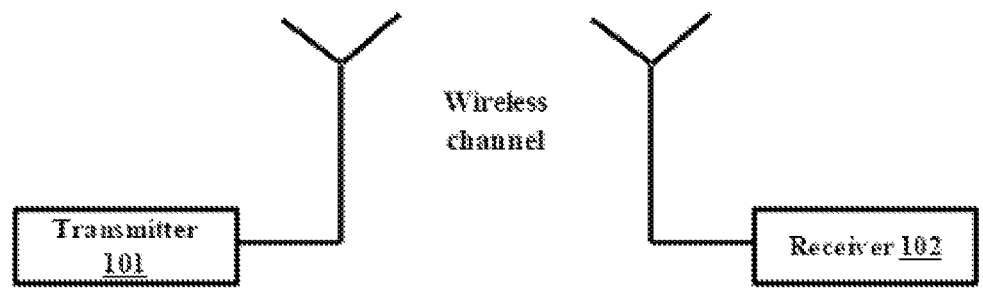
FIG. 1 is a diagram illustrating an example of a wireless communication system.

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. Also, descriptions of functions and constructions that are well known to one of ordinary skill in the art may be omitted for increased clarity and conciseness.

Throughout the drawings and the detailed description, the same reference numerals refer to the same elements. The drawings may not be to scale, and the relative size, proportions, and depiction of elements in the drawings may be exaggerated for clarity, illustration, and convenience.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Examples of a method of channel estimation for spread spectrum systems are described herein. The method may enable the channel estimation at the transmitter and receiver. The method includes a superimposed training sequence based channel estimation for a multicarrier spread spectrum system. The method may be applicable in single carrier, multicarrier, single input and single out, and MIMO spread spectrum systems. In a transmitter, training sequences to be used for the channel estimation are spread with respective codes. These are added to respective spread data sequences and transmitted. At a receiver, after synchronization and performing operations that ensure that a channel is flat fading, a despreading operation is carried out using the spreading codes. By virtue of an orthogonality of the spreading codes, an interference due to other unwanted training and data sequences may be removed, and an Maximum Likelihood (ML) estimate of a channel is achievable, which may not be affected by a data interference and may be only influenced by an additive white Gaussian noise. Hence, there is no bandwidth consumed for the purpose of the channel estimation, and the method achieves an estimation accuracy similar to bandwidth-consuming pilot-assisted methods.

FIG. 1 illustrates an example of a wireless communication system. The wireless communication system includes a transmitter 101 and a receiver 102. The transmitter 101 and the receiver 102 communicate with each other over a wireless channel in the wireless communication system. The wireless communication system may be a spread spectrum communication system. Each of the transmitter 101 and receiver 102 may include a channel estimation module that estimates the wireless channel. The wireless communication system may include multiple transmitters and receivers as in a MIMO multi-carrier spread spectrum system. In this example, a MIMO OFDM system with time domain spreading across each of subcarriers may be considered.

Examples of a method described herein may also be used for a single-input and single-output (SISO) OFDM system, a SISO single carrier system, a MIMO single carrier system, and other systems known to one of ordinary skill in the art. Also, the examples of the method described herein may be applicable in a sub-sampled OFDM-based sub-band system and a sub-band based SC-FDE system.

Figure 2:
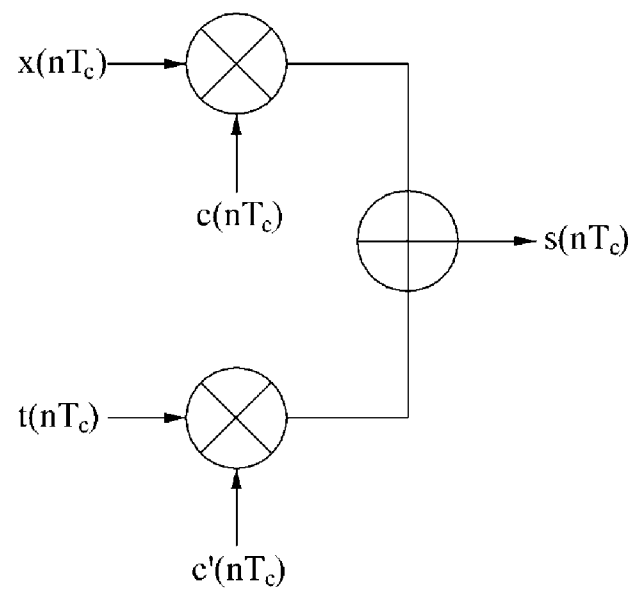
FIG. 2 is a diagram illustrating an example of a method of superimposing training sequences to data sequences after spreading.

FIG. 2 illustrates an example of a method of superimposing training sequences to data sequences after spreading. In a transmitter (e.g., the transmitter 101 of FIG. 1), the predetermined training sequences or symbols for channel estimation are spread and superimposed to chips of the spread data sequences or symbols. This is performed after appending all of preambles for other purposes, like synchronization. Prior to the superimposition, the training sequences are spread using codes with a prescribed length or spreading factor. The spreading codes are chosen to be orthogonal with spreading codes used to spread the data sequences.

In more detail, $x(nT_s)$ are incoming data sequences at a symbol rate $T_s$. Let $c(nT_c)$ be spreading codes with a chip rate $T_c$. Each of the spreading codes may include a series of one's, and be of a length or spreading factor. These are multiplied to obtain spread data sequences $x(nT_c)c(nT_c)$. These are superimposed with (e.g., added to) spread training sequences $t(nT_c)c'(nT_c)$. Net output signals $s(nT_c)$ are given by the following example of Equation 1:

$$s(nT_c) = t(nT_c)c'(nT_c) + x(nT_c)c(nT_c) \quad (1)$$

An orthogonality of spreading codes implies the following example of Equation 2:

$$\sum_{n=0}^{N_F-1} c(nT_c)c'(nT_c) = \begin{cases} 1 & c(nT_c) = c'(nT_c) \\ 0 & c(nT_c) \neq c'(nT_c) \end{cases} \quad (2)$$

In Equation 2, $N_F$ is a spreading factor of the spreading codes $c(nT_c)$ used to spread the training sequences.

Figure 3:
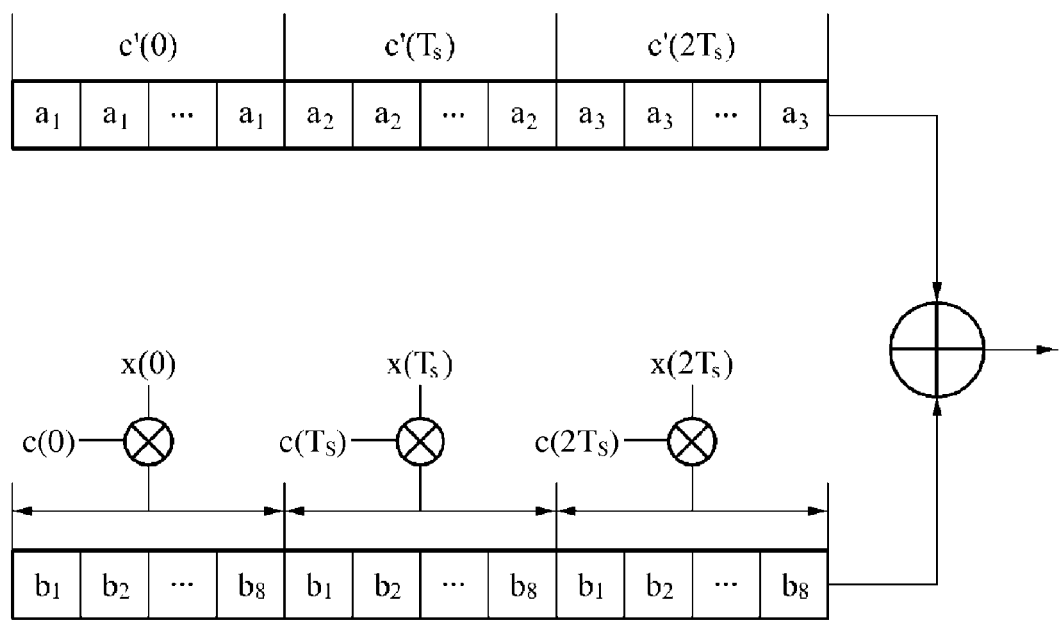
FIG. 3 is a diagram illustrating an example of a method of adding each of elements of superimposed training sequences to data sequences.

FIG. 3 illustrates an example of a method of adding each of elements of superimposed training sequences to data sequences. In a transmitter, each of the elements (e.g., c'(0), c'($T_s$), and c'($2T_s$)) of the superimposed training sequences (e.g., s($nT_c$) of FIG. 2) is repeated $N_F$ times, e.g., to generate elements $a_1$, $a_2$, and $a_3$, respectively. The elements are added to the respective data sequences x(0), x($T_s$), and x($2T_s$), which are spread with spreading codes c(0), c($T_s$), and c($2T_s$) with an equal number of 1s and −1s. Each of the spread data sequences x(0)c(0), x($T_s$)c($T_s$), and x($2T_s$)c($2T_s$) includes elements $b_1$ through $b_8$. This method may be employed in lower data rate systems where spreading is employed to improve a reliability. For example, this method may be included in a broadcast scenario as in a downlink, where a channels for each of links may be estimated using the same training sequence.

Figure 4:
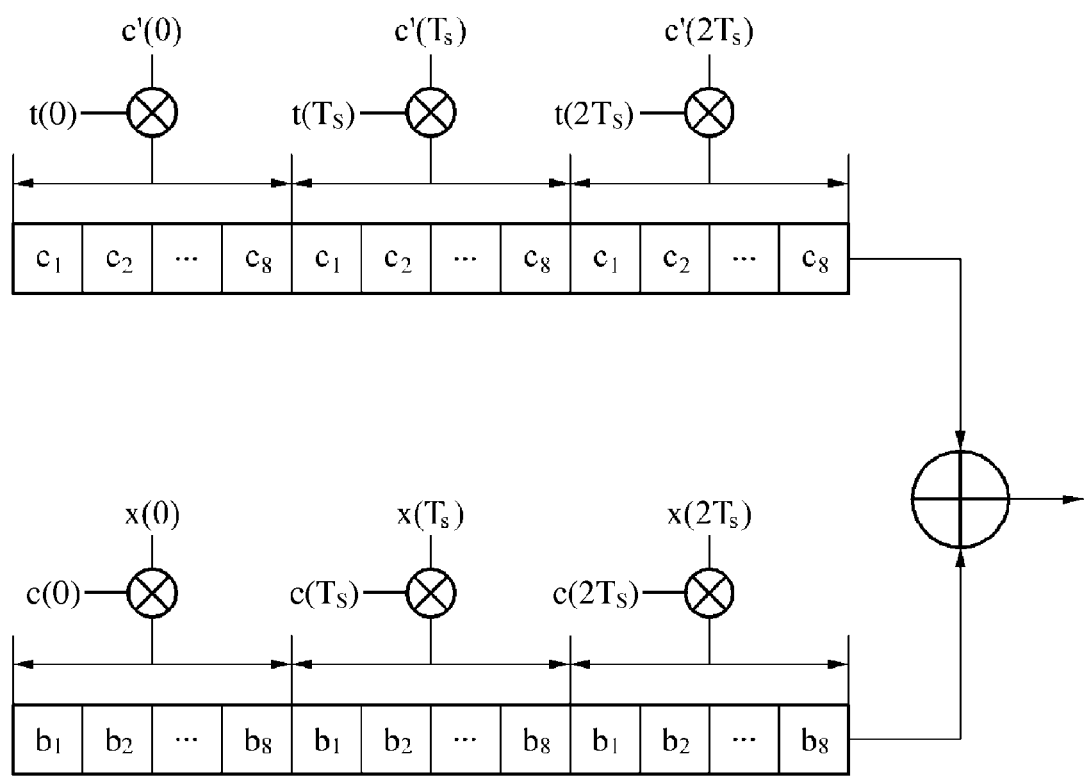
FIG. 4 illustrates is a diagram illustrating an example of a method of allocating codes from a set of orthogonal codes with a spreading factor to spread training and data sequences, respectively.

FIG. 4 illustrates an example of a method of allocating codes from a set of orthogonal codes with a spreading factor to spread training and data sequences. Referring to FIG. 4, in a transmitter, some of the orthogonal codes, namely, c'(0), c'($T_s$), and c'($2T_s$), with the spreading factor, are allocated to spread the training sequences t(0), t($T_s$), and t($2T_s$), respectively. Each of the spread training sequences c'(0)t(0), c'($T_s$)t($T_s$), and c'($2T_s$)h$2T_s$) include elements $c_1$ through $c_8$. Remaining codes from the set of the orthogonal codes, namely, c(0), c($T_s$), and c($2T_s$), with the spreading factor, are allocated to spread the data sequences x(0), x($T_s$), and x($2T_s$), respectively. Each of the spread data sequences c(0)x(0), c($T_s$)x($T_s$), and c($2T_s$)x($2T_s$) includes elements $b_1$ through $b_8$. In this example, the spreading factor $N_F$ for the training sequences and the spreading factor $N_s$ for the data sequences are the same. The spread training sequences c'(0)t(0), c'($T_s$)t($T_s$), and c'($2T_s$)t($2T_s$) are added to (e.g., superimposed with) the spread data sequences c(0)x(0), c($T_s$)x($T_s$), and c($2T_s$)x($2T_s$), respectively. This method uses the orthogonal codes for both the training and data sequences, thus affecting an overall spectral efficiency of the system.

Figure 5:
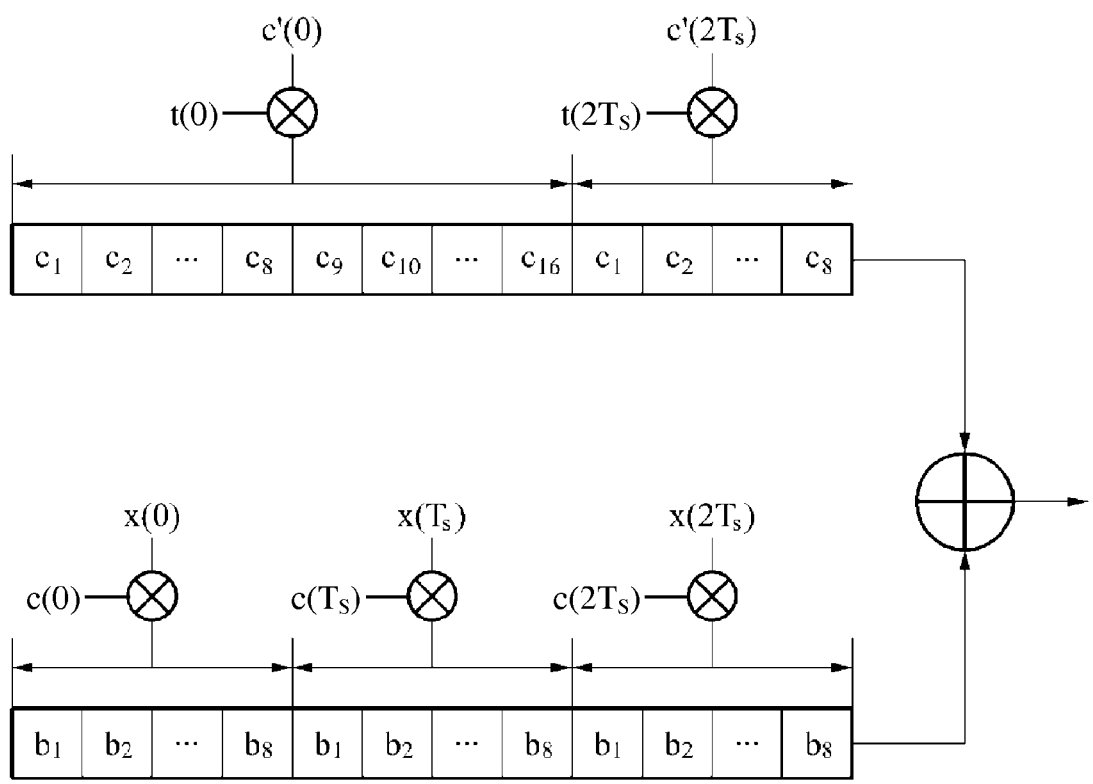
FIG. 5 is a diagram illustrating an example of a method of allocating spreading codes to spread training sequences, with a spreading factor different from another spreading factor of spreading codes used to spread data sequences.

FIG. 5 illustrates an example of a method of allocating spreading codes to spread training sequences, with a spreading factor different from another spreading factor of spreading codes used to spread data sequences. This may prevent a loss in efficiency as a number of the spreading codes spreading the data sequences may not be reduced. Also, at an end of an integration period of a spread spectrum system at a receiver during a channel estimation, a net effect of data interference on the channel estimate may be negligible.

For example, in a transmitter, spreading codes may include orthogonal codes with a variable spreading factor. Referring to FIG. 5, each of the spreading codes c(0), c($T_s$), and c($2T_s$) may include an 8-length Walsh-Hadamard code (with a spreading factor of 8 lengths) used to spread the data sequence x(0), x($T_s$), or x($2T_s$), respectively. Each of the spread data sequences c(0)x(0), c($T_s$)x($T_s$), and c($2T_s$)x($2T_s$) includes elements $b_1$ through $b_8$. Then, the method allocates the spreading codes c'(0) and c'($2T_s$) to spread the training sequences t(0) and t($2T_s$), respectively. The spreading code c'(0) includes a 16-length Walsh-Hadamard code (with a spreading factor of 16 lengths) to spread the training sequence t(0) to include elements $c_i$ through $c_m$, and the spreading code c'($2T_s$) includes a 8-length Walsh-Hadamard code to spread the training sequence t($2T_s$) to include elements $c_1$ through $c_8$. The spread training sequences c'(0)40 and c'($2T_s$)t($2T_s$) are added to (e.g., superimposed with) the spread data sequences c(0)x(0), c($T_s$)x($T_s$), and c($2T_s$)x($2T_s$), respectively.

A despreading of a 16-length training sequence may ensure that an interference between two data sequences is removed. Hence, there may be 16−8=8 spreading codes that may be used to estimate 8 independent channels. This may be useful from a point of view of discriminating MIMO channels and/or sub-band channels. The use of 8-length codes for data sequences and 16-length codes for training sequences is only an example. The method is applicable in cases where spreading codes for training and data sequences are orthogonal when integrated over a period of a spreading code for a training sequence.

Figure 6:
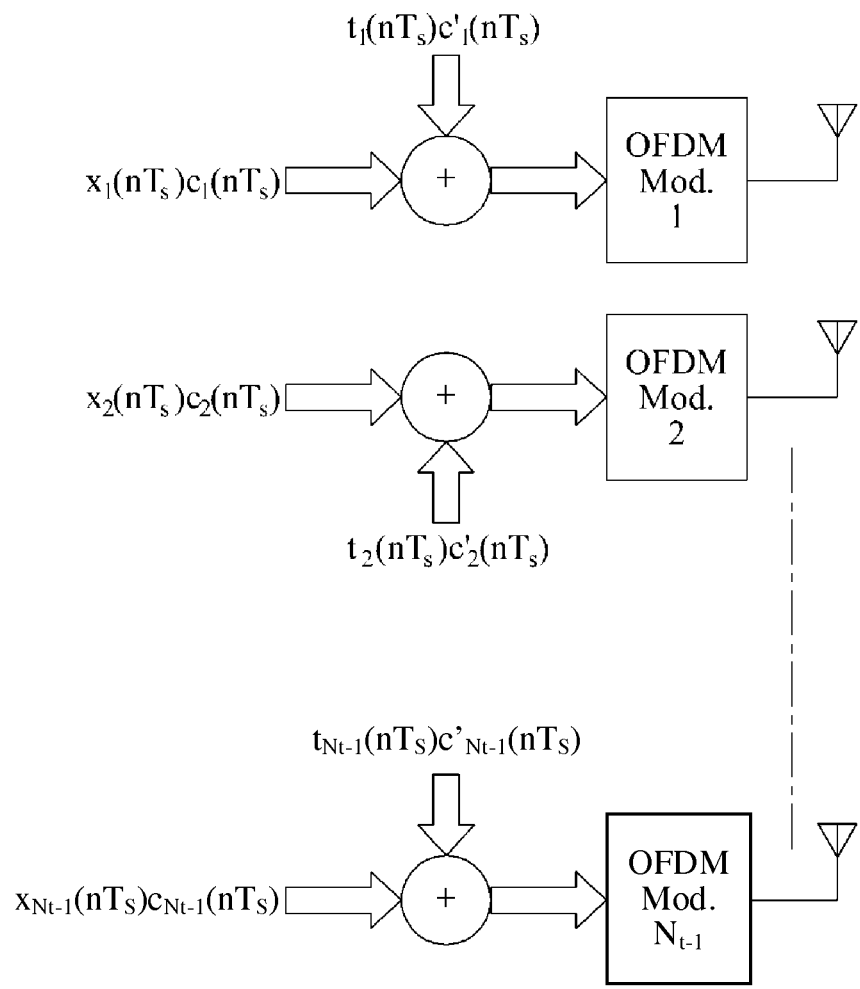
FIG. 6 is a diagram illustrating an example of a transmitter of a MIMO multi-carrier spread spectrum system employing a superimposed training sequence on a per-subcarrier basis.

FIG. 6 illustrates an example of a transmitter of a MIMO multi-carrier spread spectrum system employing a superimposed training sequence on a per-subcarrier basis. The system includes a $N_t \times N_r$ MIMO OFDM system with $N_t$ transmit antennas, $N_r$ receive antennas, and N subcarriers. In the system, a receiver includes $N_t \times N_r$ channels, and a maximum root mean square (rms) delay spread is Q. In order to estimate the $N_t$ channels at each of the $N_r$ receive antennas, a set of training sequences are used, which may be represented as the following example of Equation 3:

$$\bar{t}_t(nT_s) = \bar{t}_t(nT_s + NT_s) = e^{j\frac{2\pi nT_s}{N}\left(Qt + \frac{nT_s}{2} + 1\right)}, \quad (3)$$
$$t = 0, 1, \ldots N_t - 1$$

The training sequences include good correlation properties. Let $T_t$ be the Toeplitz matrix with dimensions N×Q that is of a $t^{th}$ transmit antenna. The good correlation properties indicate the following example of Equation 4:

$$T_i^H T_j = \begin{cases} I_{Q \times Q}, & i = j \\ 0, & i \neq j \end{cases} \quad (4)$$

Equation 4 indicates that the training sequence includes an autocorrelation being an impulse I, and a cross-correlation being zero, for lags extending at least up to the rms delay spread of a channel. Other sequences like PN sequences and perfect roots of unity sequences satisfying the above properties, may be used.

An N-point discrete Fourier transform (DFT) of each of the training sequences is performed, as represented by the following example of Equation 5:

$$\bar{t}_t^k(nT_s) = \bar{t}_t^k(nT_s + NT_s) = DFT_N\{\bar{t}_t^k(nT_s)\} \; t=0,1,\ldots N_t-1 \quad (5)$$

In Equation 5, $\bar{t}_t^k(nT_s)$ is a training sequence for the $t^{th}$ transmit antenna and a $k^{th}$ subcarrier. The transformed training sequences is spread using respective spreading codes $c'^k_t(nT_c)$, and added (e.g., superimposed) to respective spread data sequences $x_t^k(nT_c)c_t^k(nT_c)$, on the per-subcarrier basis. The superimposed training sequences are modulated and transmitted by respective OFDM modulators via the respective transmit antennas.

The transformed training sequences include non-zero values only on a few subcarriers. In this example, the spreading of the transformed training sequences and the superimposition of the spread training sequences may be performed only on those subcarriers where the transformed training sequences include the non-zero values.

The transmitter is applicable in single carrier systems when a channel encountered is a flat fading channel. For multicarrier systems, like OFDM, the transmitter is applicable when a channel encountered is on a subcarrier.

After proper synchronization, the receiver receives a signal at an $r^{th}$ receive antenna via the k-th subcarrier, as represented by the following example of Equation 6:

$$y_r^k(nT_c) = \sum_{t=0}^{N_k-1} [h_{tr}^k(nT_c)\bar{t}_t^k(nT_c)c_t'^k(nT_c) + h_{tr}^k(nT_c)x_t^k(nT_c)c_t^k(nT_c)] + w(nT_c) \quad (6)$$

In Equation 6, $h_{tr}^k(nT_c)$ is a channel gain for a flat fading channel from the $t^{th}$ transmit antenna to the $r^{th}$ receive antenna via the $k^{th}$ subcarrier, and $w(nT_c)$ is an additive white Gaussian noise. $c_t'^k(nT_c)$ and $c_t^k(nT_c)$ are similar spreading codes for the $t^{th}$ transmit antenna and the $k^{th}$ subcarrier, and $x_t^k(nT_c)$ is a data sequence for the $t^{th}$ transmit antenna and the $k^{th}$ subcarrier.

The receiver despreads the received signal prior to a channel estimation to remove a data interference that may affect the channel estimation. The despreading is performed based on the spreading codes used to spread the training sequences with an associated spreading factor, which results in the received signal being updated as the following example of Equation 7:

$$y_r'^k(nT_s) = \frac{1}{N_F} \sum_{n=m}^{m+N_F-1} y_r^k(nT_c)c_t'^k(nT_c) \quad (7)$$

An orthogonality of the spreading codes used to spread the training and data sequences, respectively, may ensure that the data interference on the ensuing channel estimation is negligible. When a transmission scheme is as illustrated in FIG. 4, then $N_F=N_s$. When a transmission scheme is as illustrated in FIG. 5, then $N_F \neq N_s$, and the spreading codes are chosen such that the received signal may be represented as the following example of Equation 8:

$$y_r'^k(nT_s) = \sum_{t=0}^{N_k-1} h_{tr}^k(nT_s)\bar{t}_t^k(nT_s) + w(nT_s) \quad (8)$$

The orthogonality of the spreading codes used to spread the training sand data sequences, respectively, may ensure that the data interference is removed. Only an interference among the training sequences of the various transmit antennas may remain.

In an example, to isolate the interference among the training sequences of the various transmit antennas and accurately estimate a channel between the $t^{th}$ transmit antenna and the $r^{th}$ receive antenna, orthogonal spreading codes with a variable spreading factor may be used. That is, a spreading code for an estimated channel sequence between the $t^{th}$ transmit antenna and the $r^{th}$ receive antenna is chosen to be orthogonal with the spreading codes for the data sequences and also spreading codes for other estimated channel sequences.

By way of the despreading, both of the interferences may be automatically removed. Accordingly, the received signal may be updated as the following example of Equation 9:

$$y_r'^k(nT_s) = h_{tr}^k(nT_s)\bar{t}_t^k(nT_s) + w(nT_s) \quad (9)$$

The estimated channel $\hat{h}_{tr}^k(nT_s)$ of the channel $h_{tr}^k(nT_c)$ may be represented as the following example of Equation 10:

$$\hat{h}_{tr}^k(nT_s) = \frac{y_r'^k(nT_s)}{\bar{t}_t^k(nT_s)} \quad (10)$$

The despreading is performed only on those subcarriers where the superimposed training sequences are non-zero. Interpolation techniques may be employed to estimate the channels at the subcarriers where the training sequences are absent.

In another example, to isolate the interference among the training sequences of the various transmit antennas and accurately estimate the channel between the $t^{th}$ transmit antenna and the $r^{th}$ receive antenna, an N-point inverse DFT (IDFT) may be performed on the despread signal $y_r'^k(nT_x)$, which may be represented as the following example of Equation 11:

$$y_r^k(nT_s) = IFDT_N[y_r'^k(nT_s)] \quad (11)$$

An inverse of an auto-correlation (Toeplitz) matrix of the training sequences may be formed by concatenating all of $T_t$, $t=[0,N_t-1]$, as represented by the following example of Equation 12:

$$[T]_{N \times QN_t} = [T_0 \, T_1 \ldots T_{N_t-1}] \quad (12)$$

The concatenation needs to be done on a one-time basis.

By performing a matrix multiplication of the Toeplitz matrix with a row matrix of the IDFT of the despread signal, an estimated time domain channel between each of the $N_t$ transmit antennas and the $r^{th}$ receive antenna including Q channel coefficients, $[h]_{N_tQ \times 1} = [h_{0r} \, h_{1r} \ldots h_{N_t-1,r}]$ is determined as the following example of Equation 13:

$$[h]_{N_tQ \times 1} = [h_{0r}, h_{1r} \ldots h_{N_t-1,r}] = (T^H T)^{-1} T^H y \quad (13)$$

The estimated channels may be used for further receiver-side processing, like equalization, space time decoding and/or other methods known to one of ordinary skill in the art. The above method is to be performed for each of the $N_r$ receive antennas 0 to $N_{r-1}$ to estimate all of respective channels.

For example, the above examples may be applicable in SISO multicarrier and single carrier systems. For the SISO single carrier system, a need to distinguish between multiple channels does not arise, and hence, a channel estimation of only a single carrier subcarrier is performed. In this example, a number $N_t$ of transmit antennas is 1, a number $N_r$ of receive antennas is 1, and a number N of subcarriers is 1. For the SISO multicarrier system multiple channels need not be estimated. In this example, a number $N_t$ of transmit antennas is 1, a number $N_r$ of receive antennas is 1, and a number N of subcarriers is N. For MIMO single carrier systems, each of a number $N_t$ of transmit antennas and a number $N_r$ of received antennas is greater than 1, and a number N of subcarriers is 1.

The examples described herein may be directly applicable to the sub-sampled OFDM based super ultra-wide band (SUWB) system. In this example, $N_t$ is a number of sub-bands instead of a number of transmit antennas, and is equal to 1. When the SUWB system is applicable to the MIMO single carrier system, $N_t$ is greater than 1.

Figure 7:
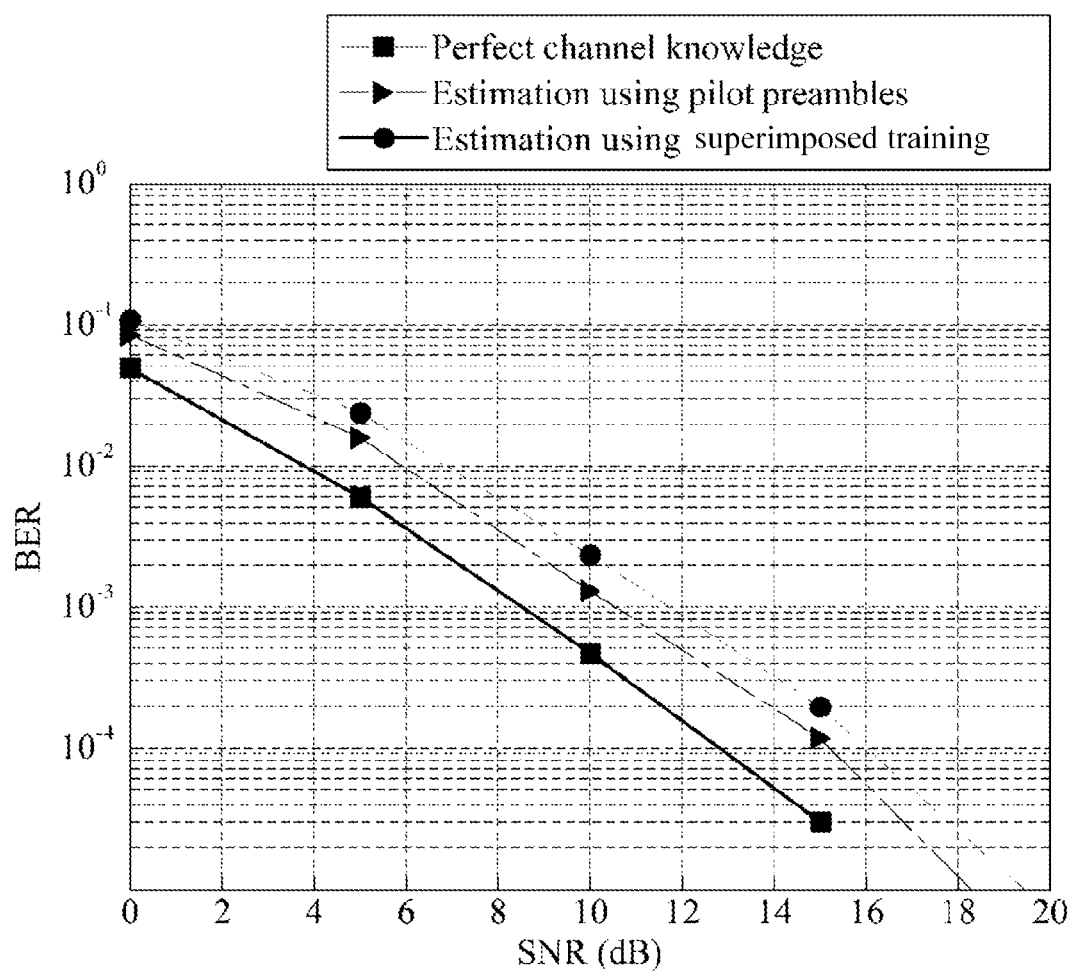
FIG. 7 is a graph illustrating an example of a comparative performance of channel estimations of a superimposed training sequence (SST)-based technique with a pilot based technique, respectively.

FIG. 7 illustrates an example of a comparative performance of channel estimations using a superimposed training sequence (SST)-based technique with a pilot-based technique, respectively. Referring to FIG. 7, an estimated channel includes a signal-to-noise ratio (SNR) per bit error rate (BER). A near comparable performance is achieved with a good bandwidth efficiency. Design parameters are given in the table below.

| Sr. No | Simulation Parameter | Value/Type |
|---|---|---|
| 1 | UWB Bandwidth (B) | 2.56 GHz |
| 2 | Number of Sub-Bands (N) | 5 |
| 3 | Number of FFT per Sub-Band ($N_b$) | 32 |
| 4 | CP Length | 3 samples |
| 7 | Modulation Type | MPSK, M = 2 |

With BPSK and sub-banding, a data rate ranges from 64 Mbps to 512 Mbps depending on a frequency diversity used that ranges from 1 to 8. A living room environment is considered in simulations. Referring to FIG. 7, the performance of the SST-based technique is nearly comparable to the performance of the pilot-based technique, but for a 1 dB performance degradation in SNR. This degradation may be reduced without significant tradeoffs being involved. In the pilot-based technique, a number of pilot symbols is 160×8=1280 symbols out of 160×8×60=76800. This may be completely avoided in the SST-based technique for the same performance. An improvement in the bandwidth efficiency may be estimated to be about 1.7 percent.

The various modules, elements, and methods described above may be implemented using one or more hardware components, one or more software components, or a combination of one or more hardware components and one or more software components.

A hardware component may be, for example, a physical device that physically performs one or more operations, but is not limited thereto. Examples of hardware components include microphones, amplifiers, low-pass filters, high-pass filters, band-pass filters, analog-to-digital converters, digital-to-analog converters, and processing devices.

A software component may be implemented, for example, by a processing device controlled by software or instructions to perform one or more operations, but is not limited thereto. A computer, controller, or other control device may cause the processing device to run the software or execute the instructions. One software component may be implemented by one processing device, or two or more software components may be implemented by one processing device, or one software component may be implemented by two or more processing devices, or two or more software components may be implemented by two or more processing devices.

A processing device may be implemented using one or more general-purpose or special-purpose computers, such as, for example, a processor, a controller and an arithmetic logic unit, a digital signal processor, a microcomputer, a field-programmable array, a programmable logic unit, a microprocessor, or any other device capable of running software or executing instructions. The processing device may run an operating system (OS), and may run one or more software applications that operate under the OS. The processing device may access, store, manipulate, process, and create data when running the software or executing the instructions. For simplicity, the singular term "processing device" may be used in the description, but one of ordinary skill in the art will appreciate that a processing device may include multiple processing elements and multiple types of processing elements. For example, a processing device may include one or more processors, or one or more processors and one or more controllers. In addition, different processing configurations are possible, such as parallel processors or multi-core processors.

A processing device configured to implement a software component to perform an operation A may include a processor programmed to run software or execute instructions to control the processor to perform operation A. In addition, a processing device configured to implement a software component to perform an operation A, an operation B, and an operation C may include various configurations, such as, for example, a processor configured to implement a software component to perform operations A, B, and C; a first processor configured to implement a software component to perform operation A, and a second processor configured to implement a software component to perform operations B and C; a first processor configured to implement a software component to perform operations A and B, and a second processor configured to implement a software component to perform operation C; a first processor configured to implement a software component to perform operation A, a second processor configured to implement a software component to perform operation B, and a third processor configured to implement a software component to perform operation C; a first processor configured to implement a software component to perform operations A, B, and C, and a second processor configured to implement a software component to perform operations A, B, and C, or any other configuration of one or more processors each implementing one or more of operations A, B, and C. Although these examples refer to three operations A, B, C, the number of operations that may implemented is not limited to three, but may be any number of operations required to achieve a desired result or perform a desired task.

Software or instructions that control a processing device to implement a software component may include a computer program, a piece of code, an instruction, or some combination thereof, that independently or collectively instructs or configures the processing device to perform one or more desired operations. The software or instructions may include machine code that may be directly executed by the processing device, such as machine code produced by a compiler, and/or higher-level code that may be executed by the processing device using an interpreter. The software or instructions and any associated data, data files, and data structures may be embodied permanently or temporarily in any type of machine, component, physical or virtual equipment, computer storage medium or device, or a propagated signal wave capable of providing instructions or data to or being interpreted by the processing device. The software or instructions and any associated data, data files, and data structures also may be distributed over network-coupled computer systems so that the software or instructions and any associated data, data files, and data structures are stored and executed in a distributed fashion.

For example, the software or instructions and any associated data, data files, and data structures may be recorded, stored, or fixed in one or more non-transitory computer-readable storage media. A non-transitory computer-readable storage medium may be any data storage device that is capable of storing the software or instructions and any associated data, data files, and data structures so that they can be read by a computer system or processing device. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, or any other non-transitory computer-readable storage medium known to one of ordinary skill in the art.

Functional programs, codes, and code segments that implement the examples disclosed herein can be easily constructed by a programmer skilled in the art to which the examples pertain based on the drawings and their corresponding descriptions as provided herein.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A method of a multi-carrier transmitter, the method comprising:
   multiplying a data sequence by a first code;
   multiplying a training sequence by a second code that is orthogonal to the first code;
   adding the multiplied data and the multiplied training sequence; and
   transmitting, to a receiver, the added data and training sequence,
   wherein the multiplying the training sequence comprises:
      performing an N-point discrete Fourier transform (DFT) on the training sequence; and
      multiplying the N-point DFT on the training sequence by the second code to occupy a subcarrier bandwidth, and
   wherein the training sequence comprises an autocorrelation that is an impulse, and a cross-correlation that is zero, for lags extending to a root mean square (rms) delay spread of a channel.

2. The method as in claim 1, wherein a length of the second code is greater than a length of the first code.

3. The method as in claim 1, wherein the transmitting comprises:
   transmitting the added data and training sequence via a subcarrier.

4. The method as in claim 1, wherein the second code comprises a series of ones, and is a same length as the first code.

5. The method as in claim 1, wherein the second code is a different length than the first code.

6. A non-transitory computer-readable storage medium storing a program comprising instructions to cause a computer to perform a method comprising:
   multiplying a data sequence by a first code;
   multiplying a training sequence by a second code that is orthogonal to the first code;
   adding the multiplied data and the multiplied training sequence; and
   transmitting, to a receiver, the added data and training sequence,
   wherein the multiplying the training sequence comprises:
      performing an N-point discrete Fourier transform (DFT) on the training sequence; and
      multiplying the N-point DFT on the training sequence by the second code to occupy a subcarrier bandwidth, and
   wherein the training sequence comprises an autocorrelation that is an impulse, and a cross-correlation that is zero, for lags extending to a root mean square (rms) delay spread of a channel.

7. A multi-carrier transmitter comprising:
   a processor configured to
      multiply a data sequence by a first code;
      multiply a training sequence by a second code that is orthogonal to the first code, wherein the multiplying the training sequence comprises performing a N-point discrete Fourier transform (DFT) on the training sequence and multiplying the N-point DFT on the training sequence by the second code to occupy a subcarrier bandwidth;
      add the multiplied data and training sequence; and
      transmit the added data and training sequence to a receiver,
      wherein the training sequence comprises an autocorrelation that is an impulse, and a cross-correlation that is zero, for lags extending to a root mean square (rms) delay spread of a channel.

8. The transmitter as in claim 7, wherein the second code comprises a variable length.

9. The transmitter as in claim 7, wherein the transmitter is included in a multiple-input and multiple-output (MIMO) multi-carrier system or a single-input and single-output (SISO) multi-carrier system.

10. The transmitter as in claim 7, wherein the processor is further configured to:
    transmit the added data and training sequence via a subcarrier.

11. The transmitter as in claim 7, wherein the second code comprises a series of ones, and is a same length as the first code.

12. The transmitter as in claim 7, wherein the second code is of a different length than the first code.

13. The transmitter as in claim 7, wherein the processor is further configured to:
    transmit the added data and training sequence through a channel comprising an ultra-wideband (UWB) channel, or a sub-band ultra-wideband (SUWB) channel, or a wireless local area network (WLAN) channel, or an orthogonal frequency-division multiplexing (OFDM)-SUWB channel, or any combination thereof.

14. The method as in claim 1, wherein the adding comprises adding the multiplied data and training sequence on a per-subcarrier basis.

15. The transmitter as in claim 7, wherein the processor is further configured to:
    add the multiplied data and training sequence on a per-subcarrier basis.

* * * * *